US009773846B2

(12) United States Patent
Oh et al.

(10) Patent No.: US 9,773,846 B2
(45) Date of Patent: Sep. 26, 2017

(54) BLUE ORGANIC LIGHT EMITTING DEVICE AND DISPLAY DEVICE INCLUDING THE SAME

(71) Applicant: SAMSUNG DISPLAY CO., LTD., Yongin-si, Gyeonggi-do (KR)

(72) Inventors: Ilsoo Oh, Seoul (KR); Bora Lee, Hwaseong-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 15/196,074

(22) Filed: Jun. 29, 2016

(65) Prior Publication Data

US 2017/0194387 A1     Jul. 6, 2017

(30) Foreign Application Priority Data

Dec. 31, 2015    (KR) .................. 10-2015-0190821

(51) Int. Cl.
| | | |
|---|---|---|
| *H01L 51/54* | (2006.01) | |
| *H01L 27/32* | (2006.01) | |
| *H01L 51/52* | (2006.01) | |
| *H01L 51/50* | (2006.01) | |
| *H01L 33/08* | (2010.01) | |
| *H01L 33/14* | (2010.01) | |

(52) U.S. Cl.
CPC ........ *H01L 27/3211* (2013.01); *H01L 27/322* (2013.01); *H01L 51/504* (2013.01); *H01L 51/5218* (2013.01); *H01L 51/5221* (2013.01); *H01L 51/5268* (2013.01); *H01L 51/5278* (2013.01); *H01L 27/3244* (2013.01); *H01L 33/08* (2013.01); *H01L 33/14* (2013.01); *H01L 2251/5369* (2013.01)

(58) Field of Classification Search
CPC ........ H01L 33/08; H01L 33/14; H01L 51/504
USPC .................................................. 257/40, 103
See application file for complete search history.

(56) References Cited

U.S. PATENT DOCUMENTS

| | | |
|---|---|---|
| 5,294,870 A | 3/1994 | Tang et al. |
| 7,102,152 B2 | 9/2006 | Chua et al. |

(Continued)

FOREIGN PATENT DOCUMENTS

| | | |
|---|---|---|
| CN | 105161627 A | 12/2015 |
| EP | 1 811 586 A1 | 7/2007 |

(Continued)

OTHER PUBLICATIONS

European examination report dated May 15, 2017 from the European Patent Office, Application No. 16195830.1.

*Primary Examiner* — Geroge Fourson, III
(74) *Attorney, Agent, or Firm* — Lee & Morse, P.C.

(57) ABSTRACT

A blue organic light emitting device including a first electrode, a second electrode facing the first electrode, a first charge generating layer disposed between the first electrode and the second electrode, a first emission layer disposed between the first electrode and the first charge generating layer and emitting first blue light having a first wavelength region, and a second emission layer disposed between the first charge generating layer and the second electrode and emitting second blue light having a second wavelength region different from the first wavelength region. The blue organic light emitting device finally emits blue light.

20 Claims, 12 Drawing Sheets

(56) References Cited

U.S. PATENT DOCUMENTS

| | | | |
|---|---|---|---|
| 7,255,938 B2 * | 8/2007 | Hamada | H01L 51/0052 313/504 |
| 7,377,829 B2 * | 5/2008 | Ko | H01L 51/5036 445/24 |
| 7,481,562 B2 | 1/2009 | Chua et al. | |
| 8,174,034 B2 | 5/2012 | Bogner et al. | |
| 2002/0113546 A1 | 8/2002 | Seo et al. | |
| 2005/0100760 A1 * | 5/2005 | Yokoyama | H01L 51/5036 428/690 |
| 2006/0038188 A1 * | 2/2006 | Erchak | H01L 33/20 257/82 |
| 2006/0214903 A1 | 9/2006 | Kurosaka | |
| 2009/0146552 A1 * | 6/2009 | Spindler | H01L 51/5036 313/504 |
| 2010/0163854 A1 * | 7/2010 | Kho | H01L 51/504 257/40 |
| 2011/0281388 A1 | 11/2011 | Gough et al. | |
| 2012/0161111 A1 * | 6/2012 | Chiang | H01L 27/3209 257/40 |
| 2014/0183496 A1 * | 7/2014 | Heo | H01L 27/3209 257/40 |
| 2015/0279909 A1 * | 10/2015 | Tsuji | H01L 51/504 257/40 |
| 2015/0280161 A1 * | 10/2015 | Song | H01L 51/504 257/40 |

FOREIGN PATENT DOCUMENTS

| | | |
|---|---|---|
| JP | 2013073759 A * | 4/2013 |
| KR | 10-2012-0077301 A | 7/2012 |
| KR | 10-2013-0050802 A | 5/2013 |
| KR | 10-1475118 B1 | 12/2014 |
| KR | 10-2015-0022516 A | 3/2015 |
| KR | 10-2015-0062759 A | 6/2015 |

* cited by examiner

BLUE ORGANIC LIGHT EMITTING DEVICE AND DISPLAY DEVICE INCLUDING THE SAME

CROSS-REFERENCE TO RELATED APPLICATION

Korean Patent Application No. 10-2015-0190821, filed on Dec. 31, 2015, in the Korean Intellectual Property Office, and entitled: "Blue Organic Light Emitting Device and Display Device Including the Same," is incorporated by reference herein in its entirety.

BACKGROUND

1. Field

The present disclosure herein relates to a blue organic light emitting device and a display device including the same.

2. Description of the Related Art

Flat display devices may be mainly classified as a light emitting type and a light receiving type. The light emitting type includes a flat cathode ray tube, a plasma display panel, an organic light emitting display (OLED), etc. The OLED is a self-luminescent display and has advantages of wide viewing angles, good contrast and rapid response time.

The OLED may be used as a display for mobile devices, e.g., a digital camera, a video camera, a camcorder, a personal digital assistant, a smart phone, an ultra-thin laptop, a tablet personal computer, a flexible display, etc., or for large-sized electronic products, e.g., an ultra-thin television or a large-sized electric products. The OLED displays color based on the principle that holes and electrons injected from a first electrode and a second electrode are recombined in an emission layer, and excitons generated by the combination of the injected holes and electrons in the emission layer emit light via the transition thereof from an excited state to a ground state.

SUMMARY

An embodiment of the present disclosure provides a blue organic light emitting device including a first electrode, a second electrode facing the first electrode, a first charge generating layer disposed between the first electrode and the second electrode, a first emission layer disposed between the first electrode and the first charge generating layer and emitting first blue light having a first wavelength region, and a second emission layer disposed between the first charge generating layer and the second electrode and emitting second blue light having a second wavelength region different from the first wavelength region.

In an embodiment, a difference between a peak wavelength in the first wavelength region and a peak wavelength in the second wavelength region may be greater than about 0 nm and less than about 30 nm or less.

In an embodiment, one of the first wavelength region or the second wavelength region may be from about 440 nm to less than about 460 nm, and the other of the first wavelength region or the second wavelength region may be from about 460 nm to about 490 nm.

In an embodiment, a second charge generating layer disposed between the second emission layer and the second electrode, and a third emission layer disposed between the second charge generating layer and the second electrode and emitting third blue light having a third wavelength region, may be further included. The third wavelength region may be different from each of the first wavelength region and the second wavelength region.

In an embodiment, a difference between a peak wavelength in the first wavelength region and a peak wavelength in the second wavelength region may be greater than about 0 nm and less than about 30 nm or less, and a difference between a peak wavelength in the second wavelength region and a peak wavelength in the third wavelength region may be greater than about 0 nm and less than about 30 nm or less.

In an embodiment, one of the first wavelength region, the second wavelength region or the third wavelength region may be from about 440 nm to less than about 460 nm, one of remaining two wavelength regions may be from about 460 nm to less than about 470 nm, and the remaining wavelength region may be from about 470 nm to about 480 nm.

In an embodiment, the first charge generating layer may include an n-type charge generating layer adjacent to the first electrode, and a p-type charge generating layer adjacent to the second electrode and disposed on the n-type charge generating layer.

In an embodiment of the present disclosure, a display device includes a blue organic light emitting device and a color changing layer disposed on the blue organic light emitting device, and the blue organic light emitting device includes a first electrode, a second electrode facing the first electrode, a first charge generating layer disposed between the first electrode and the second electrode, a first emission layer disposed between the first electrode and the first charge generating layer and emitting first blue light having a first wavelength region, and a second emission layer disposed between the first charge generating layer and the second electrode and emitting second blue light having a second wavelength region different from the first wavelength region.

In an embodiment, the color changing layer may include a resin layer and a color changing material included in the resin layer.

In an embodiment, the color changing material may include at least one selected from the group consisting of an inorganic phosphor, an organic phosphor, a quantum dot and an organic dye.

In an embodiment, a difference between a peak wavelength in the first wavelength region and a peak wavelength in the second wavelength region may be greater than about 0 nm and less than about 30 nm or less.

In an embodiment, one of the first wavelength region or the second wavelength region may be from about 440 nm to less than about 460 nm, and the other of the first wavelength region or the second wavelength region may be from about 460 nm to about 490 nm.

In an embodiment, a second charge generating layer disposed between the second emission layer and the second electrode, and a third emission layer disposed between the second charge generating layer and the second electrode and emitting third blue light having a third wavelength region may be further included, and the third wavelength region may be different from each of the first wavelength region and the second wavelength region.

In an embodiment, a difference between a peak wavelength in the first wavelength region and a peak wavelength in the second wavelength region may be greater than about 0 nm and less than about 30 nm or less, and a difference between a peak wavelength in the second wavelength region and a peak wavelength in the third wavelength region may be greater than about 0 nm and less than about 30 nm or less.

In an embodiment, one of the first wavelength region, the second wavelength region or the third wavelength region may be from about 440 nm to less than about 460 nm, one of remaining two wavelength regions may be from about 460 nm to about less than 470 nm, and the remaining wavelength region may be from about 470 nm to about 480 nm.

In an embodiment, the first charge generating layer may include an n-type charge generating layer adjacent to the first electrode, and a p-type charge generating layer adjacent to the second electrode and disposed on the n-type charge generating layer.

In an embodiment, the display device may include a plurality of pixels, each pixel may be divided into a red emission region, a green emission region and a blue emission region, and the color changing layer may include a first color changing material disposed in the red emission region, and a second color changing material disposed in the green emission region.

In an embodiment, the color changing layer may further include a scattering layer disposed in the blue emission region.

In an embodiment, the scattering layer may include a resin layer and a scattering material included in the resin layer.

In an embodiment, the first electrode may be a reflection type electrode, and the second electrode may be disposed between the first electrode and the color changing layer and may be a transmission type electrode or a transflective type electrode.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
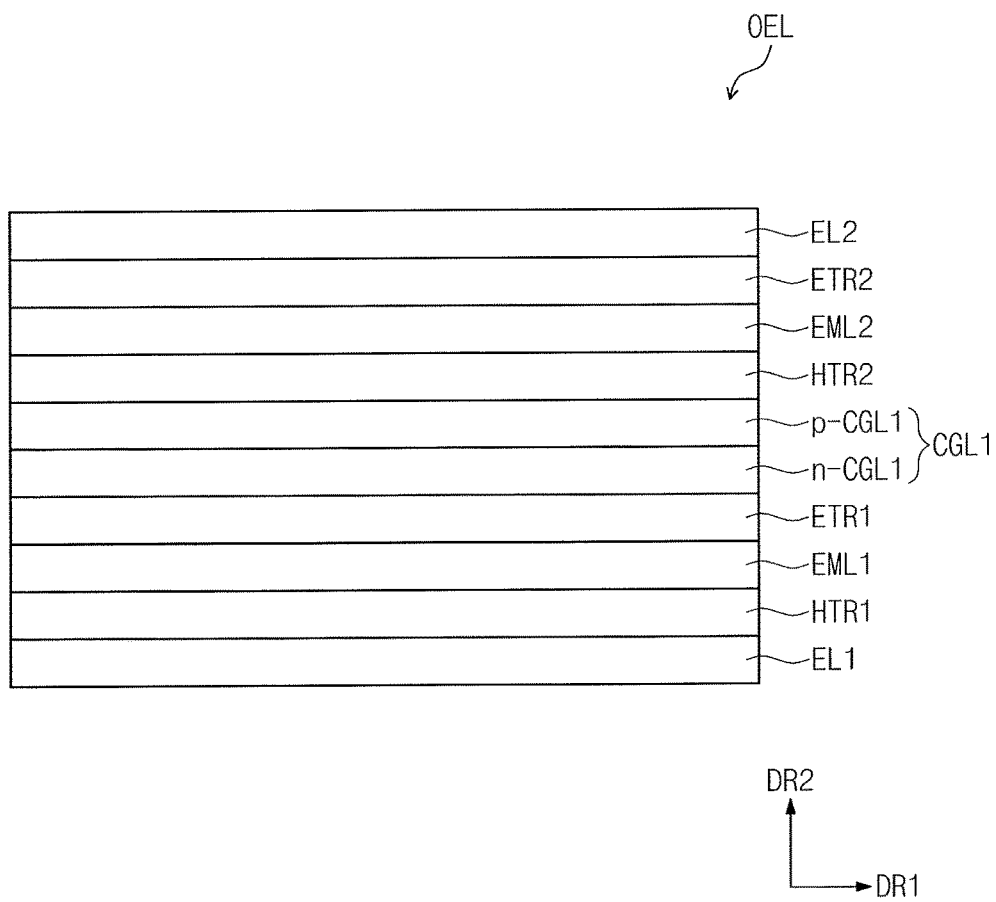
FIG. 1 illustrates a cross-sectional schematic view of a blue organic light emitting device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

Like reference numerals refer to like elements for explaining each drawing. In the drawings, the sizes and relative sizes of elements may be enlarged for clarity of the present disclosure. It will be understood that, although the terms first, second, etc. may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

It will be further understood that the terms "comprises" and/or "comprising," when used in this specification, specify the presence of stated features, steps, operations, and/or devices, but do not preclude the presence or addition of one or more other features, steps, operations, and/or devices thereof. It will also be understood that when a layer, a film, a region, a plate, etc. is referred to as being 'on' another part, it can be directly on the other part, or intervening layers may also be present. On the contrary, when a layer, a film, a region, a plate, etc. is referred to as being 'under' another part, it can be directly under the other part, or intervening layers may also be present. Hereinafter, a blue organic light emitting device according to an embodiment of the present disclosure will be described in detail.

Figure 2:
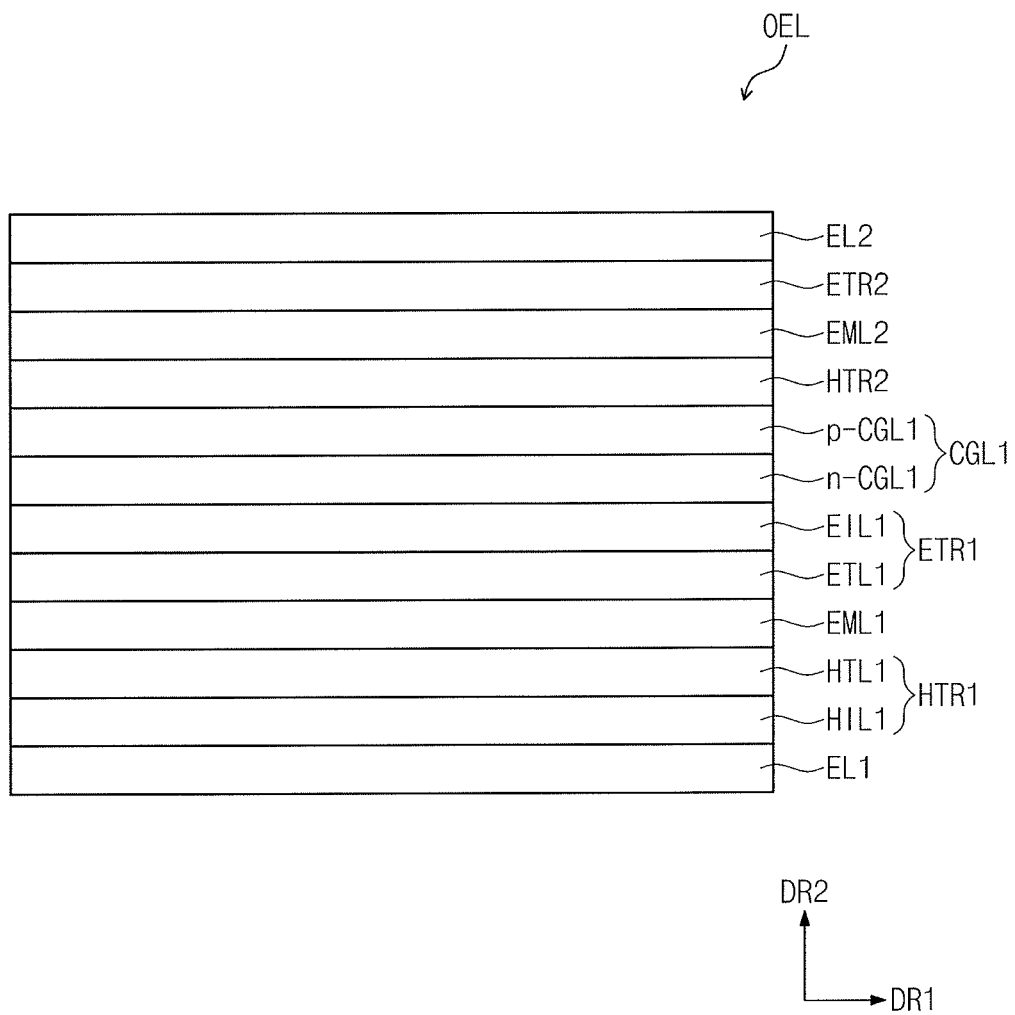
FIG. 2 illustrates a cross-sectional schematic view of a blue organic light emitting device according to an embodiment of the present disclosure.
Figure 3:
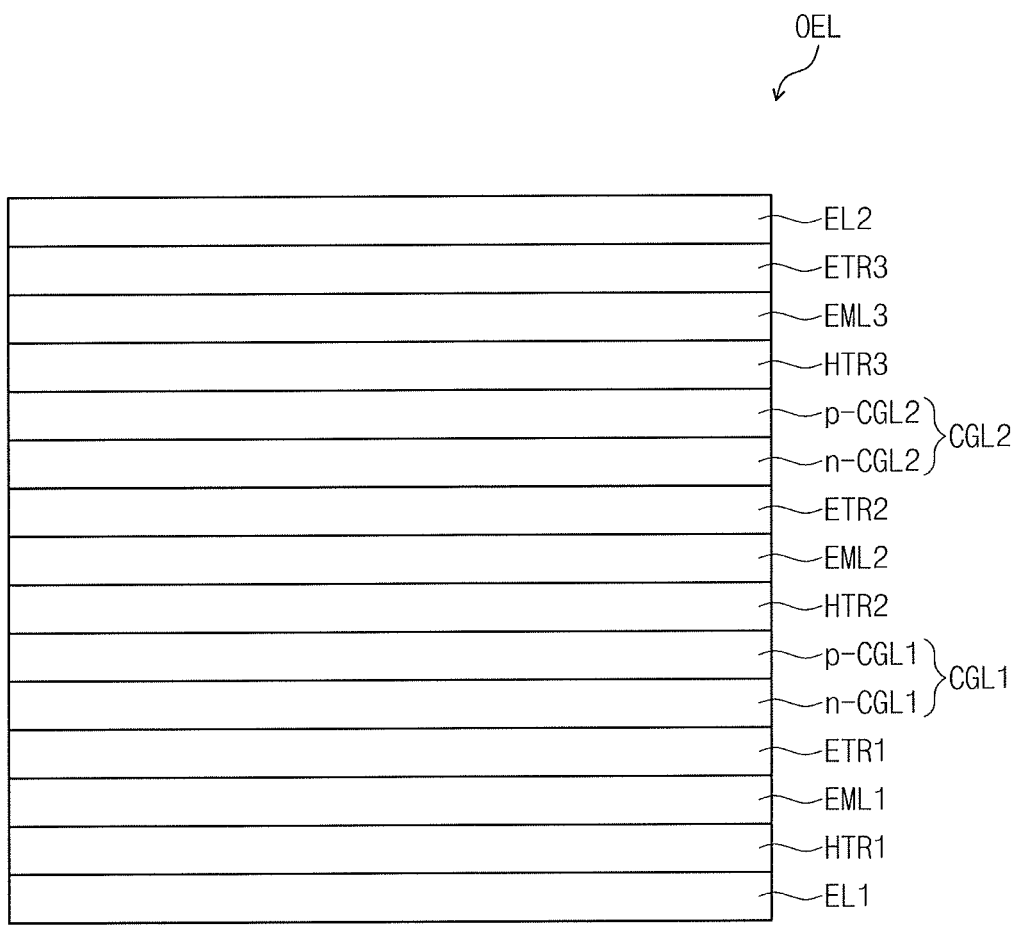
FIG. 3 illustrates a cross-sectional schematic view of a blue organic light emitting device according to an embodiment of the present disclosure.
Figure 3:

FIG. 1 illustrates a cross-sectional schematic view of a blue organic light emitting device according to an embodiment of the present disclosure. FIG. 2 illustrates a cross-sectional schematic view of a blue organic light emitting device according to an embodiment of the present disclosure. FIG. 3 illustrates a cross-sectional schematic view of a blue organic light emitting device according to an embodiment of the present disclosure. For conciseness, elements common to all three embodiments will be discussed first.

Referring to FIGS. 1, 2 and 3, a blue organic light emitting device OEL according to an embodiment of the present disclosure includes a first electrode EL1, a first emission layer EML1, a first charge generating layer CGL1, a second emission layer EML2, and a second electrode EL2, may be sequentially stacked, e.g., laminated one by one, in a second direction DR2.

The first electrode EL1 and the second electrode EL2 face each other. The first charge generating layer CGL1 is disposed between the first electrode EL1 and the second electrode EL2. The first emission layer EML1 is disposed between the first electrode EL1 and the first charge generating layer CGL1. The second emission layer EML2 is disposed between the first charge generating layer CGL1 and the second electrode EL2.

The organic light emitting device OEL according to an embodiment of the present disclosure is a blue organic light emitting device OEL. The organic light emitting device OEL according to an embodiment of the present disclosure is a blue organic light emitting device that emits blue light. Each of the first emission layer EML1 and the second emission layer EML2 emits blue light. In particular, the first emission layer EML1 emits first blue light having a first wavelength region, and the second emission layer EML2 emits second blue light having a second wavelength region. The first wavelength region and the second wavelength region are different from each other, e.g., may be completely different from each other or may partially overlap.

That is, the first emission layer EML1 and the second emission layer EML2 emit blue light having different wavelength regions. In other words, the organic light emitting device OEL according to an embodiment of the present disclosure includes the first emission layer EML1 and the second emission layer EML2, each emitting blue light, with the resultant mixture of light emitted is also being blue light. By using two emission layers emitting blue light having different wavelength regions, blue emission peak may be distributed more broadly, and color visibility at side viewing angles may be improved.

A difference between a peak wavelength in the first wavelength region and a peak wavelength in the second wavelength region may be greater than about 0 nm and less than about 30 nm. The peak wavelength indicates a wavelength having a maximum intensity within a wavelength region being emitted. The difference between the peak wavelength in the first wavelength region and the peak wavelength in the second wavelength region may be from about 5 nm to about 20 nm, without limitation.

One of the first wavelength region or the second wavelength region may be from about 440 nm to less than about 460 nm, and the other of the first wavelength region or the second wavelength region may be from about 460 nm to about 490 nm. However, the first wavelength region and the second wavelength region are not limited thereto, and the first wavelength region and the second wavelength region may partially overlap. For example, both the first wavelength region and the second wavelength region may include 460 nm. The overlap between of the first wavelength region and the second wavelength region may be, for example, from about 1 nm to about 30 nm. One of the first wavelength region or the second wavelength region may be a deep blue light region, and the other of the first wavelength region or the second wavelength region may be a sky blue light region.

One emission wavelength region of the two emission layers emitting blue light may emit relatively long wavelengths in the blue region, and the other emission wavelength region may emit relatively short wavelengths in the blue region. Thus, the blue organic light emitting device may emit combined blue light having a more broadly distributed emission peak compared to using a single emission layer or a single emission region. Through this, color visibility at side viewing angles may be improved when compared to a conventional blue organic light emitting device emitting blue light having a sharp emission peak.

The first electrode EL1 has electrical conductivity. The first electrode EL1 may be a pixel electrode or an anode. The first electrode EL1 may be a transmission type electrode, a transflective type electrode or a reflection type electrode. When the first electrode EL1 is the transmission type electrode, the first electrode EL1 may include a transparent metal oxide, e.g., indium tin oxide (ITO), indium zinc oxide (IZO), zinc oxide (ZnO), indium tin zinc oxide (ITZO), etc. When the first electrode EL1 is the transflective type electrode or the reflection type electrode, the first electrode EL1 may include, e.g., silver (Ag), magnesium (Mg), aluminum (Al), platinum (Pt), palladium (Pd), gold (Au), nickel (Ni), neodymium (Nd), iridium (Ir), chromium (Cr), a mixture of metals, etc.

The second electrode EL2 has electrical conductivity and may be a common electrode or a cathode. The second electrode EL2 may be a transmission type electrode, a transflective type electrode or a reflection type electrode. When the second electrode EL2 is the transmission type electrode, the second electrode EL2 may include, e.g., lithium (Li), calcium (Ca), lithium fluoride (LiF)/Ca, LiF/Al, Al, Mg, barium fluoride (BaF), Ba, Ag, a compound thereof or a mixture thereof (for example, a mixture of Ag and Mg), etc. However, embodiments are not limited thereto and the second electrode EL2 may include, for example, ITO, IZO, ZnO or ITZO.

The second electrode EL2 may be connected with an auxiliary electrode. The auxiliary electrode may use any material known in the art. For example, the auxiliary electrode may include Li, Ca, LiF/Ca, LiF/Al, Al, Mg, BaF, Ba, Ag, a compound thereof or a mixture thereof (for example, a mixture of Ag and Mg), ITO, IZO, ZnO, ITZO, etc. The auxiliary electrode may be connected with the second electrode EL2 to decrease the resistance value of the second electrode EL2.

When the second electrode EL2 is the transflective type electrode or the reflection type electrode, the second electrode EL2 may include Ag, Mg, Al, Pt, Pd, Au, Ni, Nd, Ir, Cr, Li, Ca, LiF/Ca, LiF/Al, Mo, Ti, a compound thereof or a mixture thereof (for example, a mixture of Ag and Mg), etc. The second electrode EL2 may be a reflective layer or a transflective layer formed using the above material or a multilayered structure including a transparent conductive layer formed using ITO, IZO, ZnO, ITZO, etc.

When the blue organic light emitting device OEL according to an embodiment of the present disclosure is a front luminescent type, the first electrode EL1 may be the reflection type electrode, and the second electrode EL2 may be the transmission type electrode or the transflective type electrode. When the blue organic light emitting device OEL is the front luminescent type, high aperture ratios may be favorably secured.

The organic light emitting device OEL according to an embodiment of the present disclosure is a tandem type blue organic light emitting device OEL. As described above, the blue organic light emitting device OEL according to an embodiment of the present disclosure includes the first charge generating layer CGL1 disposed between the first electrode EL1 and the second electrode EL2. The blue organic light emitting device OEL according to an embodiment of the present disclosure has a structure including a first stack including the first emission layer EML1 disposed under the first charge generating layer CGL1 and a second stack including the second emission layer EML2 disposed on the first charge generating layer CGL1, with the first charge generating layer CGL1 as a reference. On the first stack, the first charge generating layer CGL1 is disposed. The first stack and the second stack are sequentially stacked, e.g., laminated one by one, in the second direction DR2.

The first charge generating layer CGL1 may inject charges into each emission layer. The first charge generating layer CGL1 may control the charge balance between the first stack and the second stack. The first charge generating layer CGL1 may include an n-type charge generating layer n-CGL1 and a p-type charge generating layer p-CGL1. The p-type charge generating layer p-CGL1 may be disposed on the n-type charge generating layer n-CGL1.

The first charge generating layer CGL1 may have a junction structure of the n-type charge generating layer n-CGL1 and the p-type charge generating layer p-CGL1. The n-type charge generating layer n-CGL1 may be disposed closer to the first electrode EL1 than to the second electrode EL2. The p-type charge generating layer p-CGL1 may be disposed closer to the second electrode EL2 than to the second electrode EL2. In other words, the n-type change generating layer n-CGL1 may be closer to the first electrode EL1 than the p-type charge generating layer p-CGL1, and vice versa with respect to the second electrode EL2.

The n-type charge generating layer n-CGL1 supplies electrons to the first emission layer EML1 adjacent to the first electrode EL1, and the p-type charge generating layer p-CGL1 supplies holes to the second emission layer EML2 included in the second stack. Between the n-type charge generating layer n-CGL1 and the p-type charge generating layer p-CGL1, a buffer layer may be further disposed. By disposing the first charge generating layer CGL1 between the first stack and the second stack and providing charges to each emission layer, emission efficiency may increase and a driving voltage may decrease.

The first stack may further include a first hole transport region HTR1 disposed between the first electrode EL1 and the first emission layer EML1. The first hole transport region HTR1 may include at least one of a hole injection layer or a hole transport layer. The first hole transport layer HTR1 may further include at least one of a hole buffer layer or an electron blocking layer.

The first hole transport region HTR1 may have a single layer formed using a single material, a single layer formed using a plurality of different materials, or a multilayered structure including a plurality of layers formed using a plurality of different materials.

For example, the first hole transport region HTR1 may have the structure of a single layer formed using a plurality of different materials, or a stacked, e.g., laminated, structure from the first electrode EL1, of hole injection layer/hole transport layer, hole injection layer/hole transport layer/hole buffer layer, hole injection layer/hole buffer layer, hole transport layer/hole buffer layer or hole injection layer/hole transport layer/electron blocking layer, without limitation.

The first hole transport region HTR1 may be formed using common methods known in the art. For example, the first hole transport region HTR1 may be formed using various methods, e.g., a vacuum deposition method, a spin coating method, a cast method, a Langmuir-Blodgett (LB) method, an inkjet printing method, a laser printing method, a laser induced thermal imaging (LITI) method, etc.

When the first hole transport region HTR1 includes the hole injection layer, the first hole transport region HTR1 may include a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-tris(N,N-diphenylamino)triphenylamine (TDATA), 4,4',4"-tris{N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), etc., without limitation.

When the first hole transport region HTR1 includes the hole transport layer HTL, the first hole transport region HTR1 may include a carbazole-based derivative such as N-phenylcarbazole and polyvinyl carbazole, a fluorene-based derivative, N,N'-bis(3-methylphenyl)-N,N'-diphenyl-[1,1-biphenyl]-4,4'-diamine (TPD), a triphenylamine-based derivative such as 4,4',4"-tris(N-carbazolyl)triphenylamine (TCTA), N,N'-di(1-naphthyl)-N,N'-diphenylbenzidine (NPB), 4,4'-cyclohexylidene bis[N,N-bis(4-methylphenyl)benzeneamine] (TAPC), etc., without limitation.

The thickness of the first hole transport region HTR1 may be from about 100 Å to about 10,000 Å, for example, from about 100 Å to about 1,000 Å. When the first hole transport region HTR1 includes both the hole injection layer and the hole transport layer, the thickness of the hole injection layer may be from about 100 Å to about 10,000 Å, for example, from about 100 Å to about 1,000 Å, and the thickness of the hole transport layer may be from about 50 Å to about 2,000 Å, for example, from about 100 Å to about 1,500 Å. When the thicknesses of the first hole transport region HTR1, the hole injection layer and the hole transport layer satisfy the above-described ranges, satisfactory hole transport properties may be obtained without substantial increase of a driving voltage.

The first hole transport region HTR1 may further include a charge generating material other than the above-described materials to improve conductivity. The charge generating material may be dispersed in the first hole transport region HTR1 uniformly or non-uniformly. The charge generating material may be, for example, a p-dopant. The p-dopant may be one of a quinone derivative, a metal oxide or a cyano group-containing compound, without limitation. For example, non-limiting examples of the p-dopant may include a quinone derivative such as tetracyanoquinodimethane (TCNQ), 2,3,5,6-tetrafluoro-tetracyanoquinodimethane (F4-TCNQ), etc., a metal oxide such as tungsten oxide, molybdenum oxide, etc., without limitation.

As described above, the first hole transport region HTR1 may further include one of the hole buffer layer and the electron blocking layer other than the hole injection layer and the hole transport layer. The hole buffer layer may compensate an optical resonance range according to the wavelength of light emitted from the first emission layer EML1 and increase light emission efficiency. Materials included in the first hole transport region HTR1 may be used as materials included in the hole buffer layer. The electron blocking layer is a layer preventing electron injection from the first electron transport region ETR1 to the first hole transport region ETR1, which will be described later.

The first stack may further include a first electron transport region ETR1 disposed between the first emission layer EML1 and the first charge generating layer CGL1. The first electron transport region ETR1 may include at least one of a hole blocking layer, an electron transport layer, or an electron injection layer, without limitation.

When the first electron transport region ETR1 includes the electron transport layer, the first electron transport region ETR1 may include at least one of tris(8-hydroxyquinolinato) aluminum (Alq3), 1,3,5-tri(1-phenyl-1H-bonzo[d]imidazol- 2-yl)phenyl (TPBi), 2,9-dimethyl-4,7-diphenyl-1,10-phenanthroline (BCP), 4,7-diphenyl-1.10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylpehnyl)-1,3,4-oxadiazole (tBu-PBD), bis(2-methyl-8-quinolinolato-N1, 08)-(1,1'-biphenyl-4-olato)aluminum (BAlq), berylliumbis(benzoquinolin-10-olate (Bebq2), 9,10-di(naphthalene-2-yl)anthracene (ADN), or a mixture thereof, without limitation. The thickness of the electron transport layer may be from about 100 Å to about 1,000 Å, for example, from about 150 Å to about 500 Å. If the thickness of the electron transport layer satisfies the above-described range, satisfactory electron transport properties may be obtained without substantial increase of a driving voltage.

When the first electron transport region ETR1 includes the electron injection layer, the first electron transport region ETR1 may include LiF, lithium quinolate (LiQ), $Li_2O$, BaO, NaCl, CsF, a metal in lanthanides such as Yb, or a metal halide such as RbCl and RbI, without limitation. The electron injection layer also may be formed using a mixture material of the hole transport material and an insulating organo metal salt. The organo metal salt may be a material having an energy band gap of greater than or equal to about 4 eV. Particularly, the organo metal salt may include, for example, a metal acetate, a metal benzoate, a metal acetoacetate, a metal acetylacetonate or a metal stearate. The thickness of the electron injection layer may be from about 1 Å to about 100 Å, and from about 3 Å to about 90 Å. When the thickness of the electron injection layer satisfies the above described range, satisfactory electron injection properties may be obtained without inducing the substantial increase of a driving voltage.

The first electron transport region ETR1 may include the hole blocking layer, as described above. The hole blocking layer may include at least one of, for example, BCP or Bphen, without limitation.

The second stack is disposed on the first charge generating layer CGL1. The second stack may further include a second hole transport region HTR2 disposed between the first charge generating layer CGL1 and the second emission layer EML2. For the explanation on the second hole transport region HTR2, the above explanation of the first hole transport region may be applied. The first hole transport region HTR1 and the second hole transport region HTR2 may be the same or different.

The second stack may further include a second electron transport region ETR2 disposed between the second emission layer EML2 and the second electrode EL2. Since the explanation on the first electron transport region ETR1 may be applied to the second electron transport region ETR2, particular explanation thereof will not be repeated. The first electron transport region ETR1 and the second hole transport region ETR2 may be the same or different.

In the blue organic light emitting device OEL according to an embodiment of the present disclosure, at least one of the hole transport region HTR1 or the second hole transport region HTR2 may include at least one of the hole injection layer or the hole transport layer. In the blue organic light emitting device OEL according to an embodiment of the present disclosure, at least one of the first electron transport region ETR1 or the second electron transport region ETR2 may include at least one of the electron injection layer or the electron transport layer. For example, referring to FIG. 2, the first hole transport region HTR1 may include a first hole injection layer HIL1 and a first hole transport layer HTL1 disposed on the first hole injection layer HIL1, and the first electron transport region ETR1 may include a first electron transport layer ETL1 and a first electron injection layer EIL1 disposed on the first electron transport layer ETL1.

However, embodiments are not limited to the structure of FIG. 2. For example, even though not shown, the second hole transport region HTR2 may include a second hole injection layer HIL2 and a second hole transport layer HTL2 disposed on the second hole injection layer HIL2, and the second hole injection layer HIL2 and the second hole transport layer HTL2 may be disposed as a one layer.

Each of the first emission layer EML1 and the second emission layer EML2 may include a host and a dopant. The host may be any material commonly used without specific limitation and include Alq3, 4,4'-bis(N-carbazolyl)-1,1'-biphenyl (CBP), poly(n-vinylcarbazole) (PVK), ADN, TCTA, TPBi, 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), etc.

The first emission layer EML1 and the second emission layer EML2 emitting blue light may include a fluorescent material including at least one selected from the group consisting of, for example, spiro-DPVBi, spiro-6P, distyryl-benzene (DSB), DSA, a polyfluorene (PFO)-based polymer and a poly(p-phenylene vinylene) (PPV)-based polymer. In another embodiment, a phosphorescent material including an organometallic complex such as $(4,6-F2ppy)_2Irpic$ may be included.

As described above, the first emission layer EML1 and the second emission layer EML2 may emit blue light having different wavelength regions. In order to emit blue light having different wavelength regions, the first emission layer EML1 and the second emission layer EML2 may include the same material and may use a method of controlling a resonance range. However, the blue organic light emitting device OEL according to an embodiment of the present disclosure may have a non-resonance structure, without limitation. In order to emit blue light having different wavelength regions, the first emission layer EML1 and the second emission layer EML2 may have different materials.

Referring to FIG. 3, the blue organic light emitting device OEL according to an embodiment of the present disclosure may further include a second charge generating layer CGL2 disposed between the second emission layer EML2 and the second electrode EL2. At least one of the first charge generating layer CGL1 or the second charge generating layer CGL2 may include an n-type charge generating layer or a p-type charge generating layer. At least one of the first charge generating layer CGL1 or the second charge generating layer CGL2 may have a junction structure of an n-type charge generating layer or a p-type charge generating layer.

The second charge generating layer CGL2 may have the same structure as the first charge generating layer CGL1 as described above. For example, the second charge generating layer CGL2 may include an n-type charge generating layer n-CGL2 disposed closer to the first electrode EL1 than to the second electrode EL2, and a p-type charge generating layer p-CGL2 disposed closer to the second electrode EL2 than to the first electrode EL1. The p-type charge generating layer p-CGL2 may be disposed on the n-type charge generating layer n-CGL2.

The second charge generating layer CGL2 may have a junction structure of the n-type charge generating layer n-CGL2 and the p-type charge generating layer p-CGL2. However, an embodiment is not limited thereto. For example, between the n-type charge generating layer n-CGL2 and the p-type charge generating layer p-CGL2 of the second charge generating layer CGL2, a buffer layer may be disposed. The first charge generating layer CGL1 and the second charge generating layer CGL2 may be formed using different materials or using the same material.

Of course, only one of the first charge generating layer CGL1 or the second charge generating layer CGL2 may have the junction structure of the n-type charge generating layer and the p-type charge generating layer.

The n-type charge generating layer n-CGL2 of the second charge generating layer CGL2 supplies electrons to the second emission layer EML2, and the p-type charge generating layer p-CGL2 of the second charge generating layer CGL2 supplies holes to the third emission layer EML3.

The blue organic light emitting device OEL according to an embodiment of the present disclosure may further include a third emission layer EML3 disposed between the second charge generating layer CGL2 and the second electrode EL2. The blue organic light emitting device OEL according to an embodiment of the present disclosure may further include a third stack including a third emission layer EML3 disposed on the second charge generating layer CGL2. The blue organic light emitting device OEL according to an embodiment of the present disclosure may have a structure including a first stack including the first emission layer EML1 disposed between the first electrode EL1 and the first charge generating layer CGL1, a second stack including the second emission layer EML2 disposed between the first charge generating layer CGL1 and the second charge generating layer CGL2, and a third stack including the third emission layer EML3 disposed between the second charge generating layer CGL2 and the second electrode EL2. The first stack, the second stack, and the third stack may be sequentially stacked, e.g., laminated one by one, in the second direction DR2.

The third emission layer EML3 emits third blue light having a third wavelength region. The third wavelength region is different from the first wavelength region emitted from the first emission layer EML1. The third wavelength region is different from the second wavelength region emitted from the second emission layer EML2. That is, the blue organic light emitting device OEL according to an embodiment of the present disclosure may include three emission layers emitting blue light having different wavelength regions, none of which may overlap, two of which may overlap, or one of which may partially overlap the other two.

The difference between a peak wavelength in the first wavelength region and a peak wavelength in the second wavelength region may be greater than about 0 nm and less than about 30 nm or less. The difference between a peak wavelength in the second wavelength region and a peak wavelength in the third wavelength region may be greater than about 0 nm and less than about 30 nm or less. However, embodiments are not limited thereto.

One of the first wavelength region emitted from the first emission layer EML1, the second wavelength region emitted from the second emission layer EML2 or the third wavelength region emitted from the third emission layer EML3 may be from about 440 nm to less than about 460 nm, one of remaining two wavelength regions may be from about 460 nm to less than about 470 nm, and the remaining wavelength region may be from about 470 nm to about 480 nm. However, an embodiment is not limited thereto, and the first wavelength region and the second wavelength region may partially overlap. For example, both the first wavelength region and the second wavelength region may include the wavelength of about 460 nm. The second wavelength region and the third wavelength region may partially overlap. For example, both the second wavelength region and the third wavelength region may include the wavelength of about 470 nm. Portions of the first wavelength region and the third wavelength region may not overlap.

By disposing three emission layers emitting blue light having different wavelength regions, a blue emitting peak may be distributed more broadly when compared to an organic light emitting device including only a blue emission layer emitting blue light having a single wavelength region. Accordingly, color visibility at side viewing angles may be improved. More particularly, among three emission layers emitting blue light, one emission wavelength region may emit long wavelengths, one of two remaining wavelength regions may emit medium wavelengths, and the remaining wavelength region may emit short wavelengths. Thus, an organic light emitting device emits combined blue light having more broadly distributed emission peak. As the result, the color visibility of the side viewing angles of the organic light emitting device may be improved.

The third stack may further include a third hole transport region HTR3 disposed between the second charge generating layer CGL2 and the third emission layer EML3. The explanation on the first hole transport region HTR1 may be applied to the explanation on the third hole transport region HTR3. The third hole transport region HTR3 may be the same as or different from the first hole transport region HTR1. The third hole transport region HTR3 may be the same as or different from the second hole transport region HTR2.

The third stack may further include a third electron transport region ETR3 disposed between the third emission layer EML3 and the second electrode EL2. The explanation on the first electron transport region ETR1 may be applied to the above-mentioned explanation on the third electron transport region ETR3, and particular explanation thereof will not be repeated. The third electron transport region ETR3 may be the same as or different from the first electron transport region ETR1. The third electron transport region ETR3 may be the same as or different from the second electron transport region ETR2.

The blue organic light emitting device OEL according to an embodiment of the present disclosure has an increased driving voltage when compared to a conventional organic light emitting device not employing a tandem type structure. However, the blue organic light emitting device according to an embodiment has a high efficiency increasing rate obtained by the application of two or three emission layers having different wavelength regions with respect to a driving voltage increasing rate. The blue organic light emitting device OEL according to an embodiment of the present disclosure has merits of high efficiency and long life.

The thickness, the thickness relation, etc., of each element included in the blue organic light emitting device OEL according to an embodiment of the present disclosure are not limited to the thickness, the thickness relation, etc., illustrated in FIGS. 1, 2 and 3.

Hereinafter, a display device according to an embodiment of the present disclosure will be explained. The explanation will be concentrated on different points from the blue organic light emitting device according to an embodiment of the present disclosure described above, and unexplained parts will follow the explanation on the blue organic light emitting device according to an embodiment of the present disclosure described above.

Figure 4:
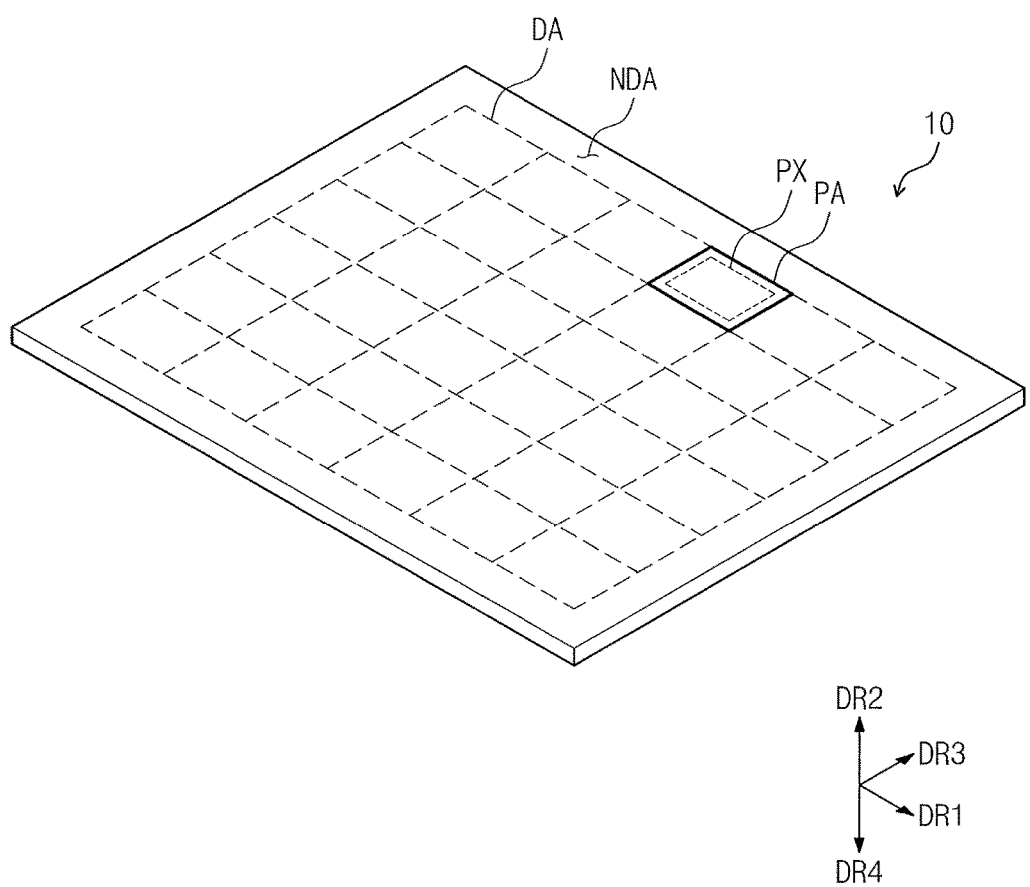
FIG. 4 illustrates a perspective schematic view of a display device according to an embodiment of the present disclosure.

FIG. 4 illustrates a perspective schematic view of a display device according to an embodiment of the present disclosure.

Referring to FIG. 4, a display device 10 according to an embodiment of the present disclosure includes a display area DA and a non-display area NDA. The display area DA displays an image. When viewed from the thickness direction of the display device 10 (for example, in DR4, which extends opposite the second direction DR2), the display area DA may have approximately a rectangle shape. However, the shape is not limited thereto.

The display area DA includes a plurality of pixel areas PA. The pixel areas PA may be arranged in a matrix. In the pixel areas PA, a plurality of pixels PX may be disposed. Each of the pixels PX includes a blue organic light emitting device (OEL of FIG. 1 or 2, although OEL of FIG. 3 could also be employed). Each of the pixels PX includes a plurality of sub-pixels SPX. The sub-pixels SPX will be explained below.

A non-display area NDA does not display an image. When viewed from the thickness direction of the display device 10 (in DR4), the non-display area NDA may be, for example, surrounded by the display area DA. The non-display area NDA may be adjacent to the display area DA in a first direction and third direction DR3, respectively. The third direction DR3 is perpendicular to each of the first direction DR1 and the second direction DR2.

Figure 5A:
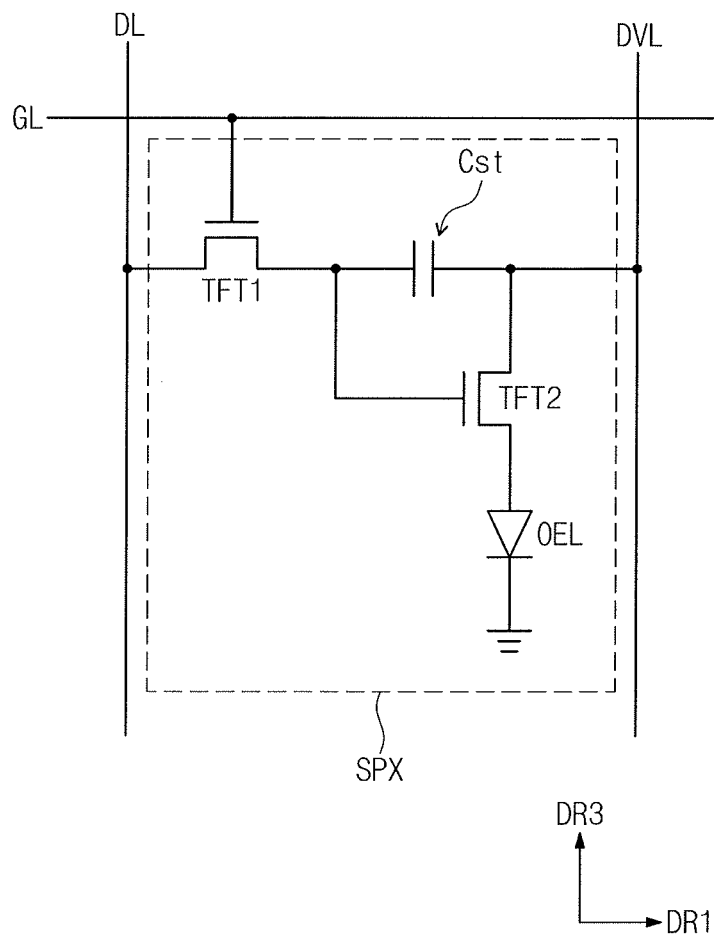
FIG. 5A illustrates a circuit diagram of one sub-pixel included in a display device according to an embodiment of the present disclosure.
Figure 5B:
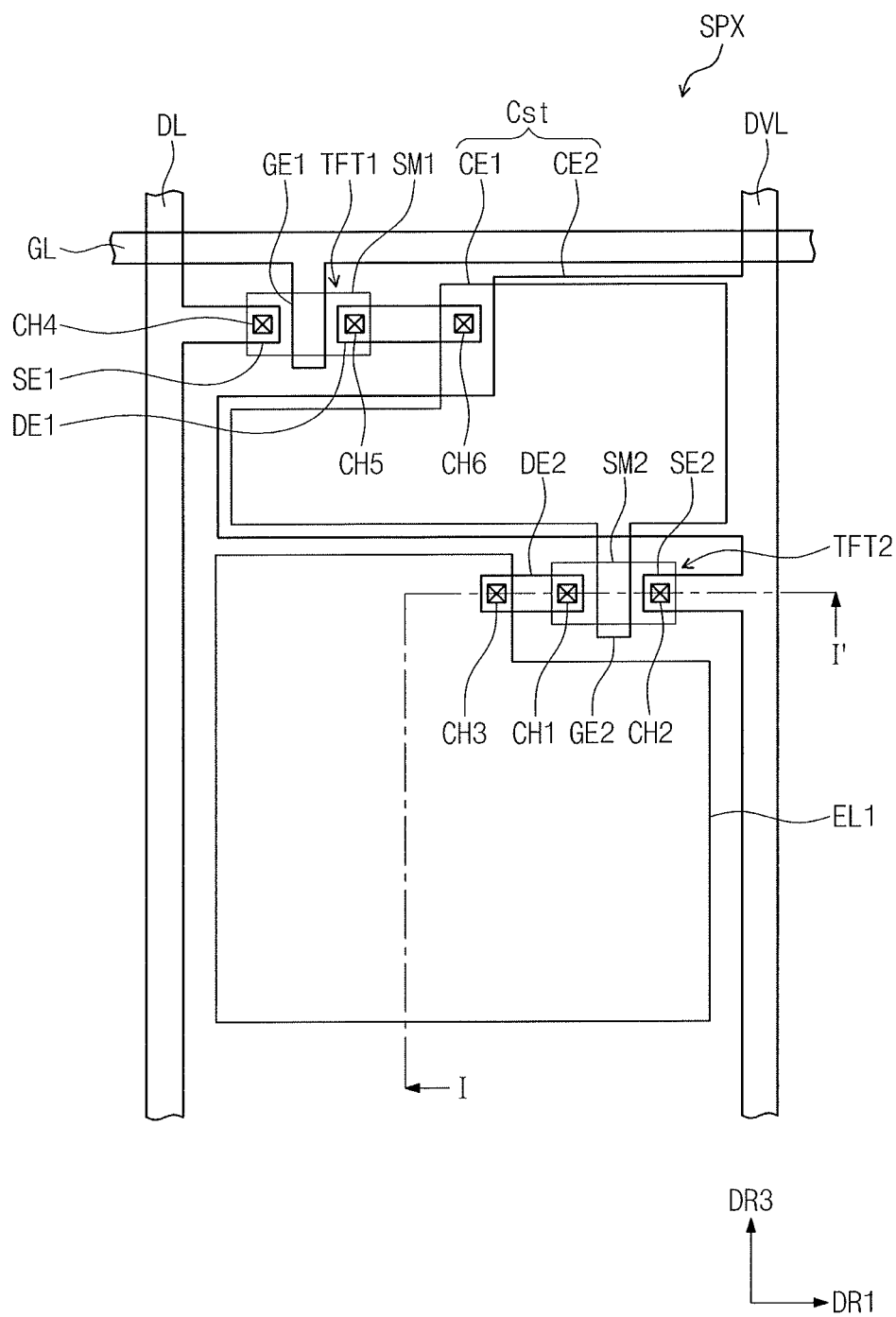
FIG. 5B illustrates a cross-sectional view of one sub-pixel included in a display device according to an embodiment of the present disclosure.
Figure 5C:
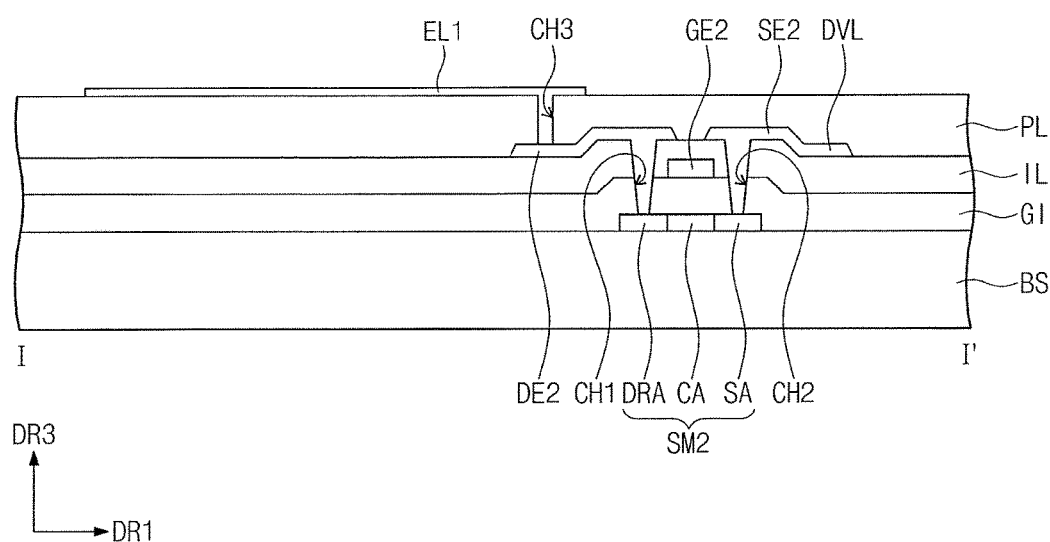
FIG. 5C illustrates a cross-sectional schematic view corresponding to line I-I' of FIG. 5B.

FIG. 5A is a circuit diagram of a sub-pixel included in a display device according to an embodiment of the present disclosure. FIG. 5B is a cross-sectional view of a sub-pixel included in a display device according to an embodiment of the present disclosure. FIG. 5C is a schematic cross-sectional view corresponding to line I-I' in FIG. 5B.

Referring to FIGS. 5A to 5C, each sub-pixel SPX may be connected with a wire part including a gate line GL, a data line DL, and a driving voltage line DVL. Each sub-pixel SPX may include thin film transistors TFT1 and TFT2 connected to the wire part, a sub organic light emitting device OEL connected to the thin film transistors TFT1 and TFT2, and a capacitor Cst.

The gate line GL extends in the first direction DR1. The data line DL extends in the third direction DR3 crossing the gate line GL. The driving voltage line DVL extends substantially parallel to the data line DL, i.e., the third direction DR3. The gate line GL transmits scanning signals to the thin film transistors TFT1 and TFT2. The data line DL transmits data signals to the thin film transistors TFT1 and TFT2. The driving voltage line DVL provides a driving voltage to the thin film transistors TFT1 and TFT2.

The thin film transistors TFT1 and TFT2 may include a driving thin film transistor TFT2 for controlling the organic light emitting device OEL and a switching thin film transistor TFT1 for switching the driving thin film transistor TFT2. In an embodiment of the present disclosure, each sub-pixel SPX includes two thin film transistors TFT1 and TFT2, however an embodiment is not limited thereto. Each sun-pixel SPX may include one thin film transistor and one capacitor, or each sub-pixel SPX may include at least three thin film transistors and at least two capacitors.

The switching thin film transistor TFT1 includes a first gate electrode GE1, a first source electrode SE1, and a first drain electrode DE1. The first gate electrode GE1 is connected to the gate line GL and the first source electrode SE1 is connected to the data line DL. The first drain electrode DE1 is connected to a first common electrode CE1 via a fifth contact hole CH5. The switching thin film transistor TFT1 transmits data signals applied to the data line DL to the driving thin film transistor TFT2 according to scanning signals applied to the gate line GL.

The driving thin film transistor TFT2 includes a second gate electrode GE2, a second source electrode SE2, and a second drain electrode DE2. The second gate electrode GE2 is connected to the first common electrode CE1. The second source electrode SE2 is connected to the driving voltage line DVL. The second drain electrode DE2 is connected to the first electrode EL1 via a third contact hole CH3.

The capacitor Cst is connected between the second gate electrode GE2 and the second source electrode SE2 of the driving thin film transistor TFT2 and charges and maintains data signals input to the second gate electrode GE2 of the driving thin film transistor TFT2. The capacitor Cst may include the first common electrode CE1 connected to the first drain electrode DE1 via a sixth contact hole CH6 and a second common electrode CE2 connected to the driving voltage line DVL.

The display device 10 according to an embodiment of the present disclosure may include a base substrate BS on which thin film transistors TFT1 and TFT2 and the organic light emitting device (OEL of FIG. 1 or OEL of FIG. 2) are stacked, e.g., laminated. Any commonly used substrate may be used as the base substrate BS, without limitation, e.g., an insulating material, for example, glass, plastics, quartz, etc. As an organic polymer forming the base substrate BS, polyethylene terephthalate (PET), polyethylene naphthalate (PEN), polyimide, polyethersulfone, etc. may be used. The base substrate BS may be selected in consideration of mechanical strength, thermal stability, transparency, surface smoothness, easiness of handling, water-proof properties, etc.

A substrate buffer layer may be provided on the base substrate BS. The substrate buffer layer may prevent the diffusion of impurities into the switching thin film transistor TFT1 and the driving thin film transistor TFT2. The substrate buffer layer may be formed using silicon nitride (SiNx), silicon oxide (SiOx), silicon oxynitride (SiOxNy), etc., and may be omitted according to the material of the base substrate BS and process conditions.

A first semiconductor layer SM1 and a second semiconductor layer SM2 may be provided on the base substrate BS. The first semiconductor layer SM1 and the second semiconductor layer SM2 are formed using a semiconductor material and function as an active layer of the switching thin film transistor TFT1 and the driving thin film transistor TFT2, respectively. Each of the first semiconductor layer SM1 and the second semiconductor layer SM2 includes a source area SA, a drain area DRA, and a channel area CA between the source area SA and the drain area DRA. Each of the first semiconductor layer SM1 and the second semiconductor layer SM2 may be formed by selecting an inorganic semiconductor or an organic semiconductor, respectively. The source area SA and the drain area DA may be doped with n-type impurities or p-type impurities.

A gate insulating layer GI may be provided on the first semiconductor layer SM1 and the second semiconductor layer SM2. The gate insulating layer GI covers the first semiconductor layer SM1 and the second semiconductor layer SM2. The gate insulating layer GI may be formed using an organic insulating material or an inorganic insulating material. A first gate electrode GE1 and a second gate electrode GE2 may be provided on the gate insulating layer GI. Each of the first gate electrode GE1 and the second gate electrode GE2 may cover a corresponding area in the channel area CA of the first semiconductor layer SM1 and the second semiconductor layer SM2.

An insulating interlayer IL may be provided on the first gate electrode GE1 and the second gate electrode GE2. The insulating interlayer IL may cover, e.g., completely cover, the first gate electrode GE1 and the second gate electrode GE2 an may be on the gate insulating layer GI. The insulating interlayer IL may be formed using an organic insulating material or an inorganic insulating material.

A first source electrode SE1, a first drain electrode DE1, a second source electrode SE2, and a second drain electrode DE2 may be provided on the insulating interlayer IL. The second drain electrode DE2 makes contact with the drain area DRA of the second semiconductor layer SM2 via a first contact hole CH1 formed in a gate insulating layer GI and the insulating interlayer IL. The second source electrode SE2 makes contact with the source area SA of the second semiconductor layer SM2 via a second contact hole CH2 formed in the gate insulating layer GI and the insulating interlayer IL. The first source electrode SE1 makes contact with the source area of the first semiconductor layer SM1 via a fourth contact hole CH4 formed in the gate insulating layer GI and the insulating interlayer IL. The first drain electrode DE1 makes contact with the drain area of the first semiconductor layer SM1 via a fifth contact hole CH5 formed in the gate insulating layer GI and the insulating interlayer IL.

The passivation layer PL may be provided on the first source electrode SE1, the first drain electrode DE1, the second source electrode SE2, and the second drain electrode DE2. The passivation layer PL may passivate the switching thin film transistor TFT1 and the driving of the thin film transistor TFT2, and/or may planarize the top surface thereof.

A first electrode EL1 may be provided on the passivation layer PL. The first electrode EL1 may be, for example, an anode. The first electrode EL1 is connected to the second drain electrode DE2 of the driving thin film transistorTFT2 via the third contact hole CH3 formed in the passivation layer PL.

Figure 6:
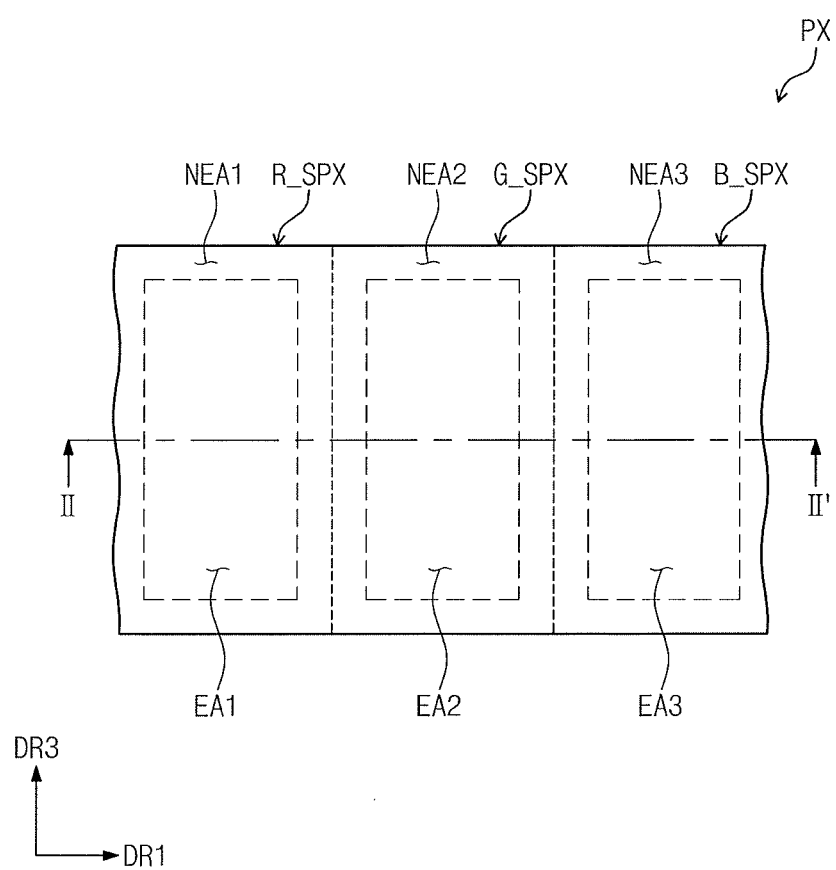
FIG. 6 illustrates a plan schematic view of one pixel included in a display device according to an embodiment of the present disclosure.

The display device 10 according to an embodiment of the present disclosure includes a plurality of pixels PX. FIG. 6 is a schematic plan view of pixels included in a display device according to an embodiment of the present disclosure.

Referring to FIG. 6, each of the pixels PX may include a plurality of the sub-pixels SPX as described above. Each of the sub-pixels may be divided into an emission region and a non-emission region. Particularly, each of the pixels PX may include a red sub-pixel R_SPX, a green sub-pixel G-SPX, and a blue sub-pixel B_SPX. The red sub-pixel R_SPX emits red light, the green sub-pixel G-SPX emits green light, and the blue sub-pixel B_SPX emits blue light.

In FIG. 6, the red sub-pixel R_SPX, the green sub-pixel G-SPX, and the blue sub-pixel B_SPX are connected one by one in the first direction DR1, however, an embodiment is not limited thereto. The red sub-pixel R_SPX, the green sub-pixel G-SPX, and the blue sub-pixel B_SPX may be connected one by one in the third direction DR3, or the red sub-pixel R_SPX, the blue sub-pixel G-SPX, and the green sub-pixel B_SPX may be connected one by one in the first direction DR1 on a plane.

In the present disclosure, the term "on a plane" may mean when viewing the display device 10 from a thickness direction (for example, in DR4 of FIG. 3).

In addition, FIG. 6 illustrates the red sub-pixel R_SPX, the green sub-pixel G-SPX, and the blue sub-pixel B_SPX having the same shape and the same size on a plane, however the shape and the size may be different, without limitation.

Each of the pixels PX may be divided into a red emission region EA1, a green emission region EA2 and a blue emission region EA3. Particularly, the red sub-pixel R_SPX is divided into a red emission region EA1 and a first non-emission region NEA1, the green sub-pixel G-SPX is divided into a green emission region EA2 and a second non-emission region NEA2, and the blue sub-pixel B_SPX is divided into a blue emission region EA3 and a third non-emission region NEA3. On a plane, the red emission region EA1, the green emission region EA2 and the blue emission region EA3 may be disposed separately one by one in the first direction DR1. The shape of each of the red emission region EA1, the green emission region EA2 and the blue emission region EA3 may be a rectangle with a longer side in the third direction DR3 than in the first direction DR1. However, the shape of each of the red emission region EA1, the green emission region EA2 and the blue emission region EA3 is not limited to the shape shown in FIG. 6.

Figure 7:
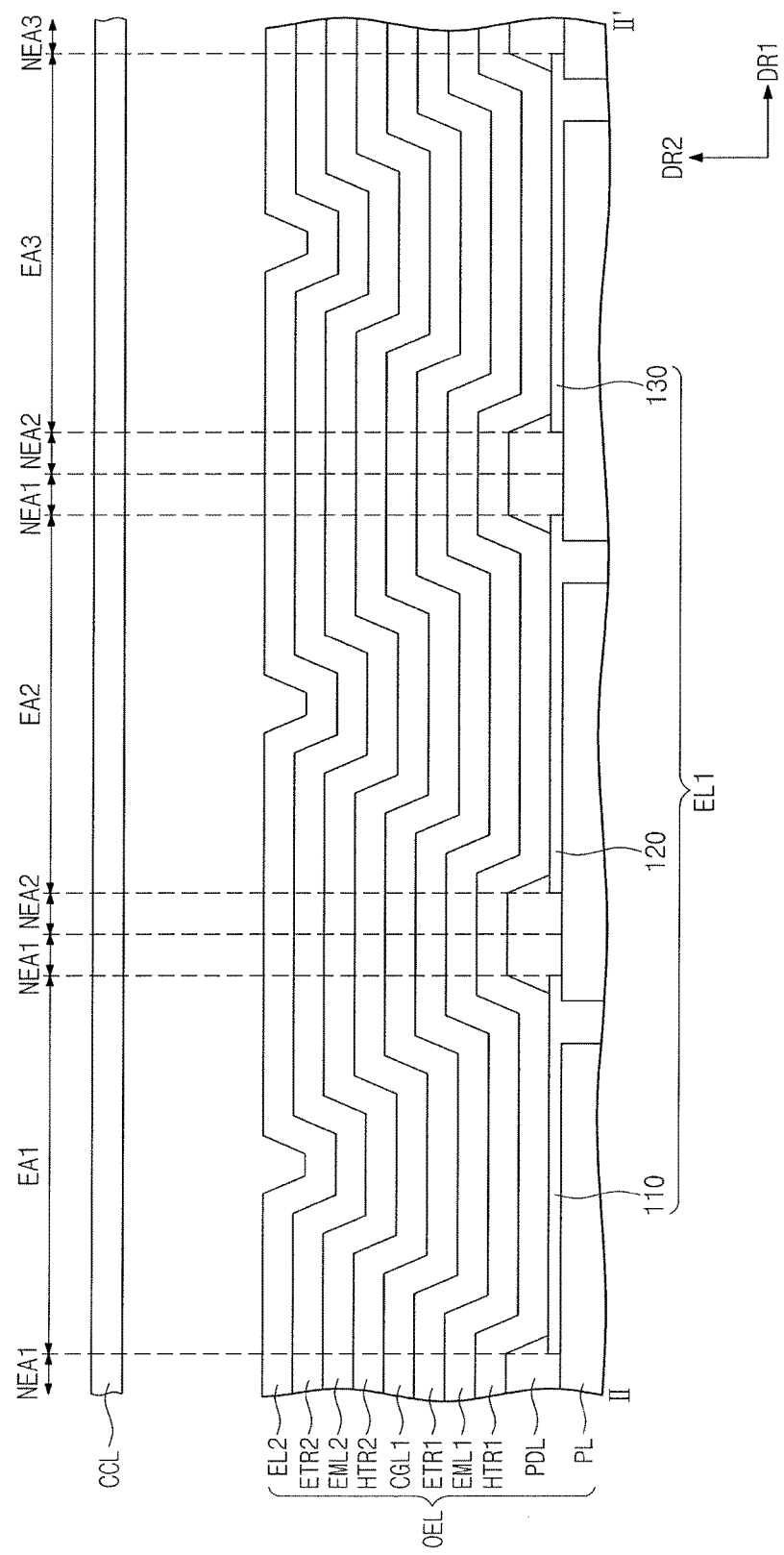
FIG. 7 illustrates a cross-sectional schematic view taken along line II-II' of FIG. 6.
Figure 8:
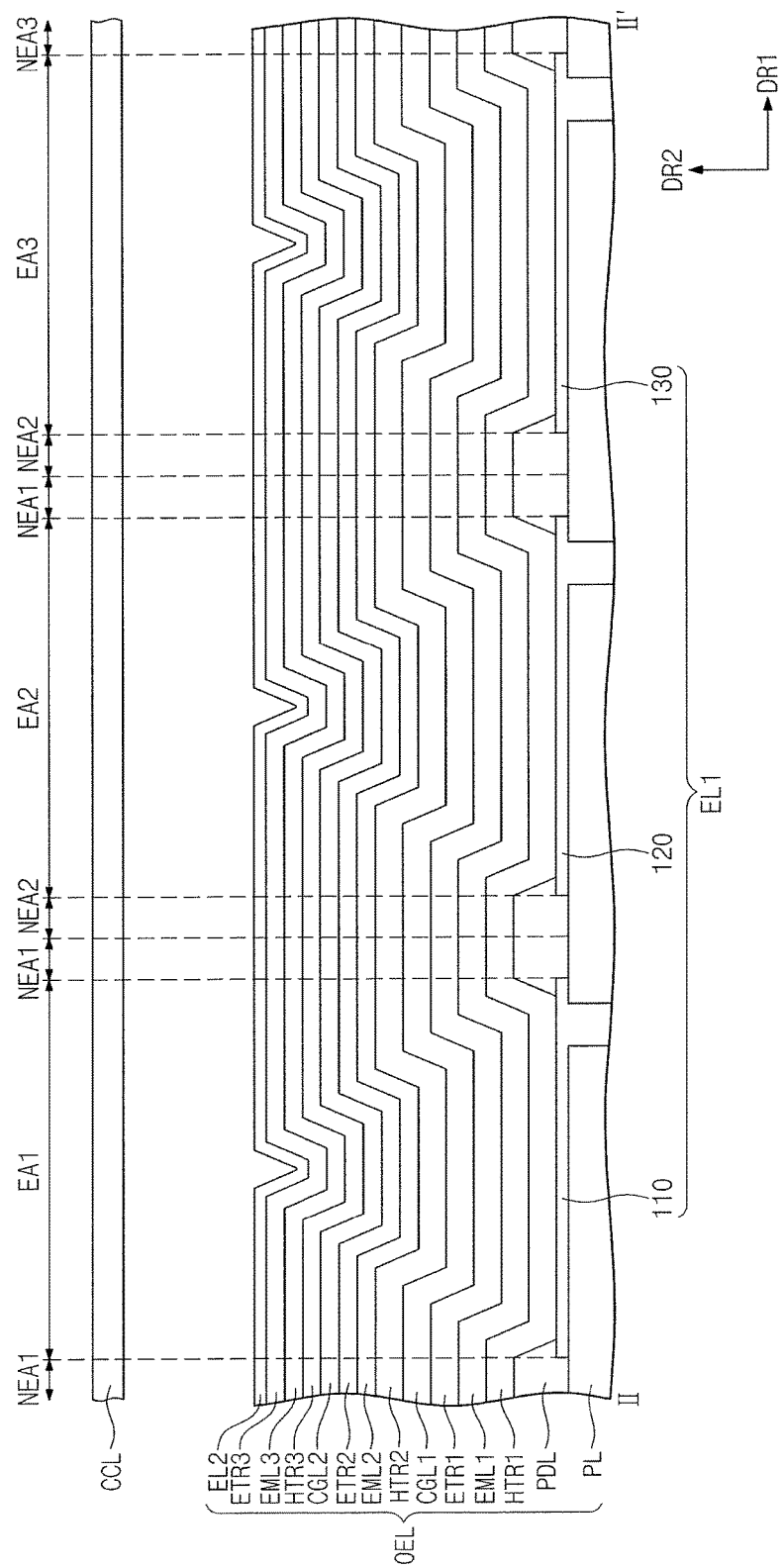
FIG. 8 illustrates a cross-sectional schematic view corresponding to line II-II' of FIG. 6.
Figure 11:
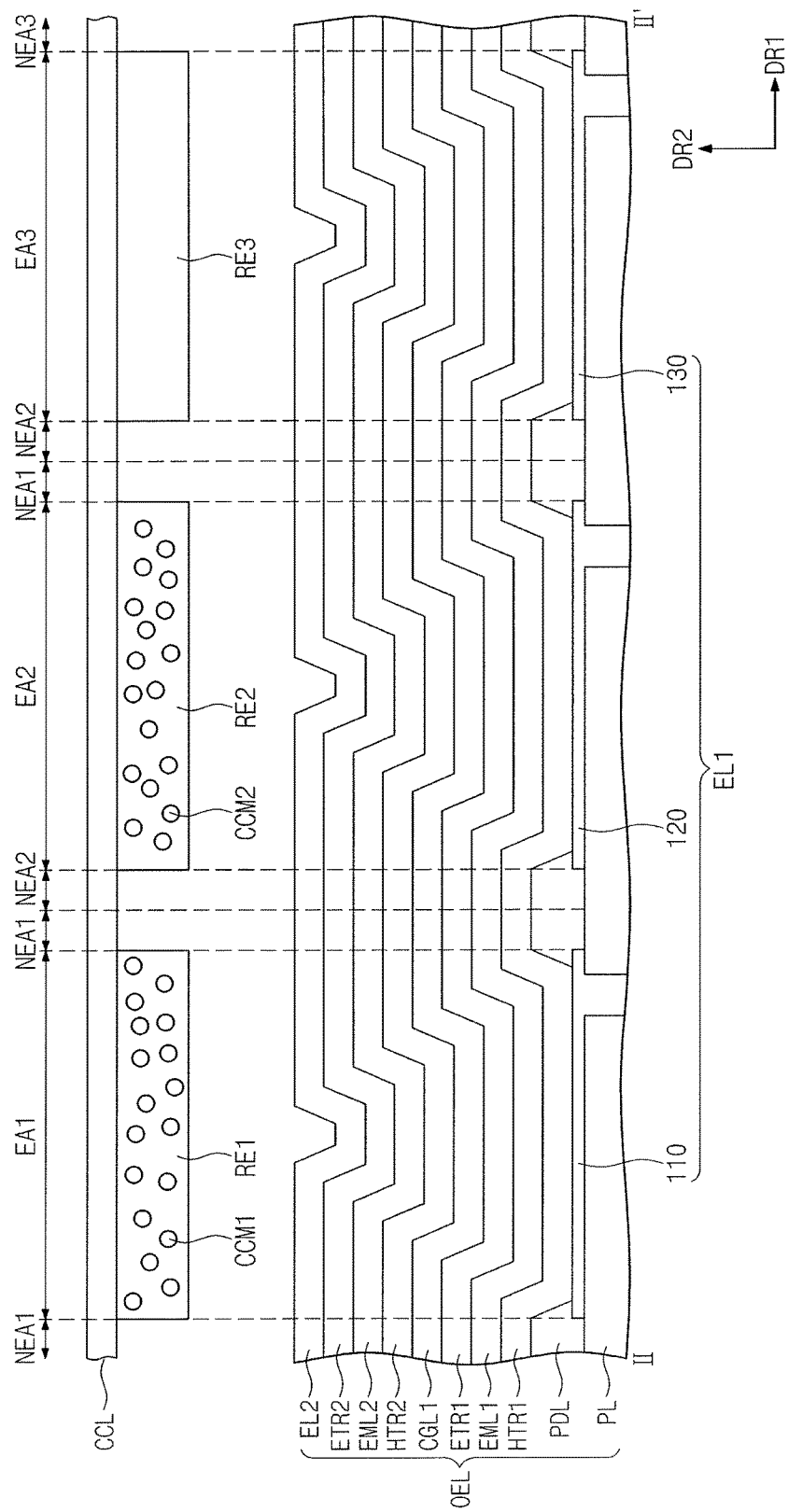
FIG. 11 illustrates a cross-sectional schematic view corresponding to line II-II' of FIG. 6.

Each of FIGS. 7, 8, and 11 is a schematic cross-sectional view corresponding to line II-II' of FIG. 6. In particular, FIGS. 7 and 11 illustrate a device using the OEL of FIG. 1, while FIG. 8 illustrates a device using the OEL of FIG. 3.

Referring to FIGS. 7, 8, and 11, the display device 10 according to an embodiment of the present disclosure includes the blue organic light emitting device OEL, and a color changing layer CCL disposed on the blue organic light emitting device OEL. The color changing layer CCL may be spaced from the blue organic light emitting device OEL, for example, in the second direction DR2.

The blue organic light emitting device OEL includes the first electrode EL1, the first emission layer EML1 emitting first blue light, the first charge generating layer CGL1, the second emission layer EML2 emitting second blue light, and the second electrode EL2, sequentially stacked, e.g., laminated one by one, in the second direction DR2, as described above. The blue organic light emitting device OEL finally emits only blue light as described above.

The first electrode EL1 includes a first sub electrode 110 disposed in the red emission region EA1, a second sub electrode 120 disposed in the green emission region EA2, and a third sub electrode 130 disposed in the blue emission region EA3.

The first sub electrode 110, the second sub electrode 120 and the third sub electrode 130 may be arranged along and separated by a distance, e.g., in the first direction DR1. The first electrode EU may be disposed by a common method known in the art. For example, the first electrode EL1 may be disposed on the passivation layer PL using a mask including aperture opening portions corresponding to each of the red emission region EA1, the green emission region EA2, and the blue emission region EA3.

The first emission layer EML1 may be disposed commonly in the red emission region EA1, the green emission region EA2, and the blue emission region EA3. Particularly, the first emission layer EML1 may be disposed commonly and continuously in the red emission region EA1, the first non-emission region NEA1, the green emission region EA2, the second non-emission region NEA2, the blue emission region EA3, and the third non-emission region NEA3. Thus, the first emission layer EML1 has an integrated shape.

The first charge generating layer CGL1 may be disposed commonly and continuously in the red emission region EA1, the green emission region EA2, and the blue emission region EA3. Particularly, the first charge generating layer CGL1 may be disposed commonly in the red emission region EA1, the first non-emission region NEA1, the green emission region EA2, the second non-emission region NEA2, the blue emission region EA3, and the third non-emission region NEA3. Thus, the first charge generating layer CGL1 has an integrated shape.

The second emission layer EML2 may be disposed commonly and continuously in the red emission region EA1, the green emission region EA2, and the blue emission region EA3. Particularly, the second emission layer EML2 may be disposed commonly in the red emission region EA1, the first non-emission region NEA1, the green emission region EA2, the second non-emission region NEA2, the blue emission region EA3, and the third non-emission region NEA3. Thus, the second emission layer EML2 has an integrated shape.

The second electrode EL2 may be disposed commonly and continuously in the red emission region EA1, the green emission region EA2, and the blue emission region EA3. Particularly, the second electrode EL2 may be disposed commonly in the red emission region EA1, the first non-emission region NEA1, the green emission region EA2, the second non-emission region NEA2, the blue emission region EA3, and the third non-emission region NEA3. The second electrode EL2 has an integrated shape.

The first electrode EL1 may be a reflection type electrode, and the second electrode EL2 may be a transmission type electrode or a transflective type electrode. In this case, the second electrode EL2 may be disposed between the first electrode EL1 and the color changing layer CCL. That is, the blue organic light emitting device OEL included in the display device 10 according to an embodiment of the present disclosure may be a front luminescent type. When the blue organic light emitting device OEL is the front luminescent type, a high aperture opening ratio may be favorably secured.

The blue organic light emitting device OEL may include constituent elements in addition to those described above. For example, a first hole transport region HTR1 disposed between the first electrode EL1 and the first emission layer EML1 may be further included. Each of the additional constituent elements may be disposed commonly and continuously in the red emission region EA1, the green emission region EA2, and the blue emission region EA3. Thus, each of the additional constituent elements may have an integrated shape. In the blue organic light emitting device OEL included in the display device 10 according to an embodiment of the present disclosure, each layer between the first electrode EL1 and the second EL2 may be deposited without a mask. For example, each layer between the first electrode EL1 and the second electrode EL2 may be deposited in vacuum using different components, without limitation.

The display device 10 according to an embodiment of the present disclosure realize red, green, and blue by using the blue organic light emitting device OEL finally emitting blue mixture light as a light source and by disposing the color changing layer on the blue organic light emitting device OEL.

The thickness, the thickness relation, etc., of each element included in the display device 10 according to an embodiment of the present disclosure are not limited to the thickness, the thickness relation, etc. illustrated in FIGS. 7, 8, and 11.

Figure 9:
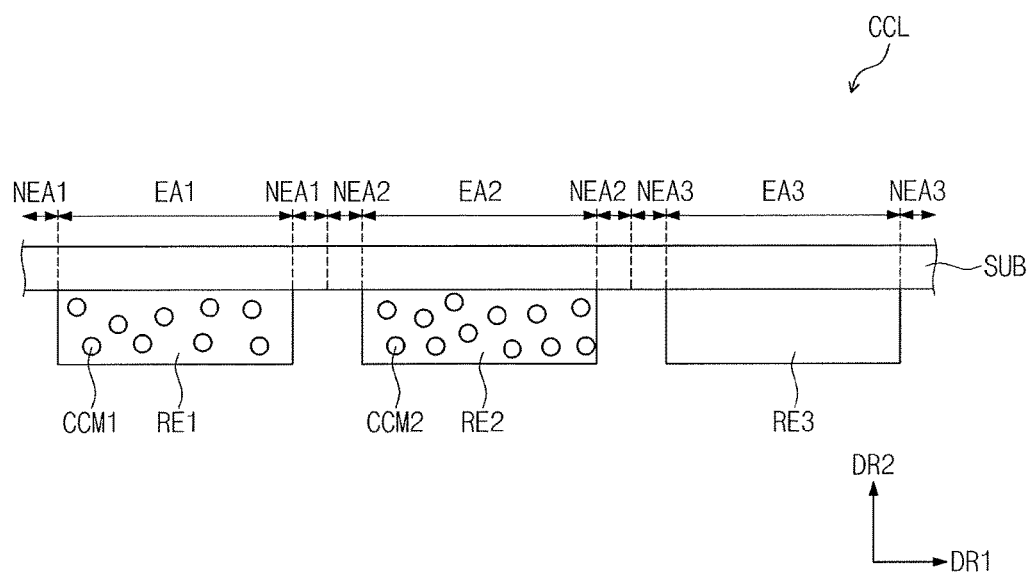
FIG. 9 illustrates a detailed cross-sectional schematic view of a color changing layer of FIGS. 7 and 8.
Figure 10:
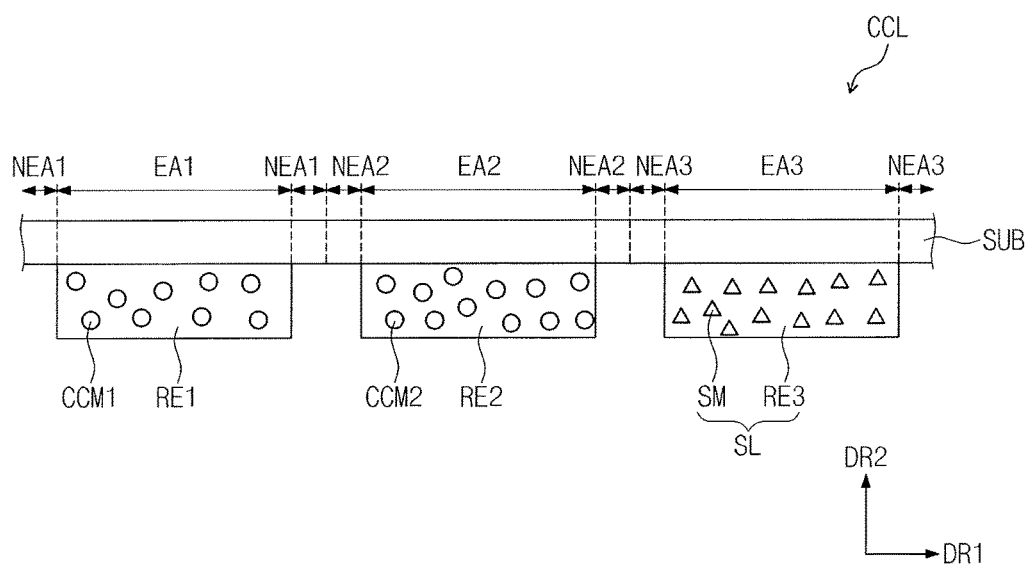
FIG. 10 illustrates a detailed cross-sectional schematic view of a color changing layer of FIGS. 7 and 8.

FIG. 9 illustrates a detailed cross-sectional view particularly illustrating a color changing layer of FIGS. 7 and 8 according to an embodiment. FIG. 10 illustrates a c detailed cross-sectional view of a color changing layer of FIGS. 7 and 8 according to an embodiment. The color changing layer CCL converts blue light provided from the blue organic light emitting device OEL into red light or green light.

Referring to FIGS. 9 and 10, the color changing layer CCL may include resin layers RE1, RE2, and RE3, and color changing materials CCM1 and CCM2. The color changing materials CCM1 and CCM2 are included in the resin layers RE1 and RE2. The color changing materials CCM1 and CCM2 are dispersed in the resin layers RE1 and RE2. The resin layers RE1, RE2, and RE3 may be a light transparent adhesive material. The resin layers RE1, RE2, and RE3 may have elasticity in view of securing durability. The resin layers RE1, RE2, and RE3 may not use a material that absorbs blue light. Non-limiting examples of the resin layers RE1, RE2, and RE3 may include epoxy, silicone, an acryl polymer, a carbonate polymer or a mixture thereof. However, embodiments are not limited thereto, and the color changing layer CCL may be a layer formed by dispersing the color changing materials CCM1 and CCM2 in an organic solution (not shown).

The resin layers RE1, RE2, and RE3 may be disposed in the red emission region EA1, the green emission region EA2 and the blue emission region EA3, respectively. The resin layer RE may include a first resin layer RE1 disposed in the red emission region EA1, a second resin layer RE2 disposed in the green emission region EA2, and a third resin layer RE3 disposed in the blue emission region EA3. The first resin layer RE1, the second resin layer RE2, and the third resin layer RE3 may be the same or different.

The resin layers RE1, RE2 and RE3 may not be disposed in the first non-emission region NEA1, the second non-emission region NEA2 and the third non-emission region NEA3. Thus, the resin layers may not be commonly and continuously disposed. However, embodiments are not limited thereto, and a portion of the resin layers RE1, RE2, and RE3 may be disposed in at least a portion of each of the first non-emission region NEA1, the second non-emission region NEA2, and the third non-emission region NEA3.

In FIGS. 9 and 10, the shape of the cross-section of each of the first resin layer RE1, the second resin layer RE2, and the third resin layer RE3 is illustrated as a rectangle, however embodiments are not limited thereto, and the shape of the cross-section may be a trapezoid, or may be converted to other shapes as occasion demands.

The color changing layer CCL may include a substrate SUB for laminating color changing materials CCM1 and CCM2. The substrate SUB may be a transparent substrate, e.g., a glass substrate. The substrate SUB may be commonly and continuously disposed in the red emission region EA1, the first non-emission region NEA1, the green emission region EA2, the second non-emission region NEA2, the blue emission region EA3 and the third non-emission region NEA3. Thus, the substrate SUB may be disposed as an integrated shape.

The color changing layer CCL may include a first color changing material CCM1 disposed in the red emission region EA1 and a second color changing material CCM2 disposed in the green emission region EA2. The first color changing material CCM1 may be dispersed in the first resin layer RE1. The second color changing material CCM2 may be dispersed in the second resin layer RE2.

The color changing materials CCM1 and CCM2 may change the wavelength of blue light provided from the blue organic light emitting device OEL. Each of the first color changing material CCM1 and the second color changing material CCM2 may include at least one selected from the group consisting of an inorganic phosphor, an organic phosphor, a quantum dot, and an organic dye.

No color changing material is in the blue emission region EA3, such that blue light provided from the blue organic light emitting device OEL is emitted without change. In the blue emission region EA3, only the third resin layer RE3 not including a color changing material may be disposed or no material may be provided on the substrate SUB in the blue emission region EA3.

The first color changing material CCM1 disposed in the red emission region EA1 changes blue light from the blue organic light emitting device OEL into red light. For example, the first color changing material CCM1 may change blue light from the blue organic light emitting device OEL into red light having a wavelength region of from about 630 nm to about 660 nm. However, the wavelength region of the red light emitted after changing via the color changing layer CCL is not limited thereto. For example, the first color changing material CCM1 may change blue light from the blue organic light emitting device OEL into red light having a wavelength region of from about 600 nm to about 640 nm.

The second color changing material CCM2 disposed in the green emission region EA2 changes blue light from the blue organic light emitting device OEL into green light. For example, the second color changing material CCM2 may change blue light from the blue organic light emitting device OEL into green light having a wavelength region of from about 520 nm to about 560 nm. However, the wavelength region of the green light emitted after changing via the color changing layer CCL is not limited thereto. For example, the second color changing material CCM2 may change blue light from the blue organic light emitting device OEL into green light having a wavelength region of from about 500 nm to about 540 nm.

White light may be obtained by the combination of red light emitted after changing via the color changing layer in the red emission region EA1, green light emitted after changing via the color changing layer CCL in the green emission region EA2, and blue light emitted without changing at the color changing layer CCL in the blue emission region EA3. That is, the display device 10 according to an embodiment of the present disclosure may finally emit white light. The final mixture light of the display device 10 according to an embodiment of the present disclosure may be white light.

In a common display device displaying red, green, and blue light by receiving blue light from an organic light emitting device and passing the color changing layer, the emission peak of the blue light is narrow, and color visibility at side viewing angles is not good. Particularly, red light and green light may be scattered via the color changing layer, and the emission peak may be broadly distributed. However, the blue light is not scattered at the color changing layer but emitted as it is, and the narrow emission peak may be emitted as it is. Accordingly, in the case where viewing angles increase from the front (viewing angle of 0°), an overlapping area of a blue emission peak with the red and green emission peaks may decrease, thereby deteriorating color visibility. Particularly, in the case where the viewing angles increase, the visibility of colors other than blue color may tend more remarkable.

The display device 10 according to an embodiment of the present disclosure uses a blue organic light emitting device OEL including at least two emission layers emitting blue light having different wavelength regions as a light source. Thus, the emission peak of the blue light may be more broadly distributed and the deterioration of color visibility due to the change of viewing angles may be minimized. That is, according to the display device 10 according to an embodiment of the present disclosure, color visibility at side viewing angles may be improved.

Referring to FIG. 10, the color changing layer CCL may further include a scattering layer SL disposed in the blue emission region EA3. The scattering layer SL may scatter blue light from the blue organic light emitting device OEL to distribute the emission peak of the blue light more broadly. The scattering layer SL may not decrease the intensity of the blue light substantially. When the emission peak of the blue light is not increased to a desired degree by the blue organic light emitting device OEL alone, the scattering layer SL may be used to broaden the emission peak of the blue light.

The scattering layer SL may include a third resin layer RE3 and a scattering material SM included in the third resin layer RE3. The scattering material SM may be dispersed in the third resin layer RE3. The third resin layer RE3 may be the same as the first resin layer RE1 disposed in the red emission region EA1 and the second resin layer RE2 disposed in the green emission layer EA2. The scattering material SM may be any common material known in the art, without limitation. Non-limiting examples of the scattering material SM may include titanium oxide ($TiO_2$), zirconium oxide ($ZrO_2$), zinc oxide (ZnO) and aluminum oxide ($Al_2O_3$).

According to the blue organic light emitting device according to an embodiment of the present disclosure, efficiency may increase and life may be extended.

According to the blue organic light emitting device according to an embodiment of the present disclosure, a wide blue emission peak may be provided and viewing angle properties may be improved.

According to the display device according to an embodiment of the present disclosure, efficiency may increase and life may be extended.

According to the display device according to an embodiment of the present disclosure, a wide blue emission peak may be provided and viewing angle properties may be improved. The present disclosure provides a blue organic light emitting device with high efficiency and long life.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A blue organic light emitting device, comprising:
   a first electrode;
   a second electrode facing the first electrode;
   a first charge generating layer between the first electrode and the second electrode;
   a first emission layer between the first electrode and the first charge generating layer, the first emission layer to emit first blue light having a first wavelength region; and
   a second emission layer between the first charge generating layer and the second electrode, the second emission layer to emit second blue light having a second wavelength region different from the first wavelength region.

2. The blue organic light emitting device as claimed in claim 1, wherein a difference between a peak wavelength in the first wavelength region and a peak wavelength in the second wavelength region is greater than about 0 nm and less than about 30 nm.

3. The blue organic light emitting device as claimed in claim 1, wherein one of the first wavelength region or the second wavelength region is from about 440 nm to less than about 460 nm, and the other of the first wavelength region or the second wavelength region is from about 460 nm to about 490 nm.

4. The blue organic light emitting device as claimed in claim 1, further comprising:
  a second charge generating layer between the second emission layer and the second electrode; and
  a third emission layer between the second charge generating layer and the second electrode, the third emission layer to emit third blue light having a third wavelength region,
  the third wavelength region being different from each of the first wavelength region and the second wavelength region.

5. The blue organic light emitting device as claimed in claim 4, wherein:
  a difference between a peak wavelength in the first wavelength region and a peak wavelength in the second wavelength region is greater than about 0 nm and less than about 30 nm, and
  a difference between a peak wavelength in the second wavelength region and a peak wavelength in the third wavelength region is greater than about 0 nm and less than about 30 nm.

6. The blue organic light emitting device as claimed in claim 4, wherein one of the first wavelength region, the second wavelength region or the third wavelength region is from about 440 nm to less than about 460 nm, one of remaining two wavelength regions is from about 460 nm to less than about 470 nm, and a remaining wavelength region is from about 470 nm to about 490 nm.

7. The blue organic light emitting device as claimed in claim 1, wherein the first charge generating layer comprises:
  an n-type charge generating layer; and
  a p-type charge generating layer, the p-type charge generating layer being on the n-type charge generating layer and between the n-type charge generating layer and the second electrode.

8. A display device, comprising:
  a blue organic light emitting device; and
  a color changing layer adjacent the blue organic light emitting device to receive blue light from the blue organic light emitting device,
  the blue organic light emitting device including:
  a first electrode;
  a second electrode facing the first electrode;
  a first charge generating layer between the first electrode and the second electrode;
  a first emission layer between the first electrode and the first charge generating layer, the first emission layer to emit first blue light having a first wavelength region; and
  a second emission layer between the first charge generating layer and the second electrode, the second emission layer to emit second blue light having a second wavelength region different from the first wavelength region.

9. The display device as claimed in claim 8, wherein the color changing layer comprises:

a resin layer; and
  a color changing material in the resin layer.

10. The display device as claimed in claim 9, wherein the color changing material includes at least one of an inorganic phosphor, an organic phosphor, a quantum dot, and an organic dye.

11. The display device as claimed in claim 8, wherein a difference between a peak wavelength in the first wavelength region and a peak wavelength in the second wavelength region is greater than about 0 nm and less than about 30 nm.

12. The display device as claimed in claim 8, wherein one of the first wavelength region or the second wavelength region is from about 440 nm to less than about 460 nm, and the other of the first wavelength region or the second wavelength region is from about 460 nm to about 490 nm.

13. The display device as claimed in claim 8, further comprising:
  a second charge generating layer between the second emission layer and the second electrode; and
  a third emission layer between the second charge generating layer and the second electrode, the third emission layer to emit third blue light having a third wavelength region;
  the third wavelength region being different from each of the first wavelength region and the second wavelength region.

14. The display device as claimed in claim 13, wherein:
  a difference between a peak wavelength in the first wavelength region and a peak wavelength in the second wavelength region is greater than about 0 nm and less than about 30 nm or less, and
  a difference between a peak wavelength in the second wavelength region and a peak wavelength in the third wavelength region is greater than about 0 nm and less than about 30 nm or less.

15. The display device as claimed in claim 13, wherein one of the first wavelength region, the second wavelength region or the third wavelength region is from about 440 nm to less than about 460 nm, one of remaining two wavelength regions is from about 460 nm to less than about 470 nm, and a remaining wavelength region is from about 470 nm to about 480 nm.

16. The display device as claimed in claim 8, wherein the first charge generating layer includes:
  an n-type charge generating layer; and
  a p-type charge generating layer, the p-type charge generating layer being on the n-type charge generating layer and between the n-type charge generating layer and the second electrode.

17. The display device as claimed in claim 8, wherein the display device comprises a plurality of pixels,
  each pixel is divided into a red emission region, a green emission region, and a blue emission region, and
  the color changing layer includes:
  a first color changing material in the red emission region; and
  a second color changing material in the green emission region.

18. The display device as claimed in claim 17, wherein the color changing layer further includes a scattering layer in the blue emission region.

19. The display device as claimed in claim 18, wherein the scattering layer comprises:
  a resin layer; and
  a scattering material in the resin layer.

20. The display device as claimed in claim 8, wherein:
the first electrode is a reflection type electrode, and
the second electrode is between the first electrode and the color changing layer, the second electrode being a transmission type electrode or a transflective type electrode.

* * * * *